US007138342B2

(12) United States Patent
Chang et al.

(10) Patent No.: US 7,138,342 B2
(45) Date of Patent: Nov. 21, 2006

(54) PROCESS OF MAINTAINING HYBRID ETCH

(75) Inventors: Cathleen H. Chang, Renton, WA (US); Terry C. Tomt, Enumclaw, WA (US)

(73) Assignee: The Boeing Company, Chicago, IL (US)

(*) Notice: Subject to any disclaimer, the term of this patent is extended or adjusted under 35 U.S.C. 154(b) by 276 days.

(21) Appl. No.: 10/698,252

(22) Filed: Oct. 31, 2003

(65) Prior Publication Data

US 2005/0095871 A1 May 5, 2005

(51) Int. Cl.
*H01L 21/302* (2006.01)
*C09K 13/00* (2006.01)
*C09K 13/04* (2006.01)

(52) U.S. Cl. .................... 438/745; 438/754; 252/79.1; 252/79.2; 252/79.3; 252/79.4

(58) Field of Classification Search ................ 438/745, 438/754; 134/2; 252/79.1, 79.2, 79.3, 79.4
See application file for complete search history.

(56) References Cited

U.S. PATENT DOCUMENTS

| | | | | |
|---|---|---|---|---|
| 2,941,949 | A * | 6/1960 | Saukaltis | 510/255 |
| 3,551,122 | A * | 12/1970 | Gulla | 428/641 |
| 4,000,082 | A | 12/1976 | Otrhalek et al. | |
| 4,191,596 | A | 3/1980 | Dollman et al. | |
| 5,271,804 | A | 12/1993 | Muller et al. | |
| 5,332,452 | A | 7/1994 | Das | |
| 5,634,979 | A | 6/1997 | Carlson et al. | |
| 5,669,980 | A | 9/1997 | McNeil et al. | |
| 5,700,768 | A | 12/1997 | Lu | |
| 5,750,070 | A | 5/1998 | Tang et al. | |
| 6,379,980 | B1 * | 4/2002 | Toprac | 438/8 |
| 2002/0066465 | A1 | 6/2002 | Gotoh et al. | |
| 2002/0179263 | A1 | 12/2002 | Eng | |
| 2003/0015221 | A1 | 1/2003 | Wei et al. | |

FOREIGN PATENT DOCUMENTS

| | | |
|---|---|---|
| EP | 1 277 830 | 1/2003 |
| WO | WO 2004/094581 | 11/2004 |

* cited by examiner

*Primary Examiner*—Nadine Norton
*Assistant Examiner*—Lynette T. Umeez-Eronini
(74) *Attorney, Agent, or Firm*—Lee & Hayes, PLLC

(57) ABSTRACT

Process for combined chemical cleaning and etching of parts made of aluminum and/or aluminum alloys including: (a) providing a cleaning and etching solution including 5–30 grams/liter of phosphoric acid; 5–30 grams/liter of hydrogen fluoride; 120–220 grams/liter of sulfamic acid; 55–85.0 grams/liter of glycol ether; and balance water; (b) contacting the parts with the solution for a time sufficient to achieve the desired amount of cleaning and etching; (c) periodically measuring the etching rate of the solution; (d) when the etching rate is below the required minimum rate, adding sufficient hydrogen fluoride to restore the etching rate above the required minimum rate; and (e) periodically adding sufficient sulfamic acid to prevent the formation of scale made of hydrated aluminum fluoride.

20 Claims, No Drawings

PROCESS OF MAINTAINING HYBRID ETCH

FIELD OF THE INVENTION

This invention relates generally to chemically cleaning and etching parts made of aluminum and/or aluminum alloys and, more specifically, to a process of combined chemically cleaning and etching parts made of aluminum and/or aluminum alloys using a hybrid etching solution.

BACKGROUND OF THE INVENTION

Aluminum parts are widely used in the aerospace, aircraft, and automobile industries. In many cases, aluminum parts must be cleaned and etched prior to being inspected using a penetrant dye process. The current practice is to clean parts manually with a solvent wipe and then perform a chemical etching on the parts in an immersion tank. There has been a long-standing need to combine the cleaning and etching steps in a single stable tank immersion instead of in multiple steps. By using a single stable tank immersion, the cleaning and etching results will be improved, manufacturing costs will be reduced, and the amount of solvent emissions will be minimized. The term "hybrid etch" refers to the combination of cleaning and etching in a single tank.

There is a commercially-available prior art liquid cleaning and etching concentrate (described in more detail below) which performs the cleaning and etching functions well when the solution in the tank is fresh. However, as the solution ages in service, the etch rate becomes too slow and a hard insoluble scale is formed in the bottom of the tank which makes it difficult to clean the tank. The prior art concentrate contains the following components:

(a) 11–55 grams/liter of phosphoric acid;
(b) 11–55 grams/liter of hydrogen fluoride (HF) (hydrofluoric acid);
(c) 110–165 grams/liter of sulfamic acid ($H_3NO_3S$);
(d) 110–165 grams/liter of propylene glycol monomethyl ether (a solvent); and
(e) balance water.

In commercial practice, the above concentrate is supplied in 55-gallon drums and is added to a tank which is one-half full of deionized water. Thus the concentrate is diluted on a 1:1 basis. Accordingly, the bath in the tank will contain the following constituents:

(a) 5.5–27.5 grams/liter of phosphoric acid;
(b) 5.5–27.5 grams/liter of hydrogen fluoride;
(c) 55–82.5 grams/liter of sulfamic acid;
(d) 55–82.5 grams/liter of propylene glycol monomethyl ether; and
(e) balance water.

As described above, an aqueous solution of the prior art product performs the cleaning and etching functions well when the solution in the tank is fresh, but as the solution ages in service, the etch rate becomes too low and a hard insoluble scale is formed in the bottom of the tank which makes it difficult to clean the tank. An applicable process specification, BAC 5786 (a process specification of The Boeing Company), requires a minimum etch rate of 0.8 mils per side per hour. BAC 5786 is incorporated herein by reference.

Previous efforts by others to stabilize the etch rate were not successful. In addition, previous efforts by others to keep the scale from forming were not successful. Therefore, there is an unmet need in the art for a process for cleaning and etching that stabilizes the etch rate and that prevents scale from forming. The present invention meets this need.

SUMMARY OF THE INVENTION

The present invention is a process for combined chemically cleaning and etching parts made of aluminum and/or aluminum alloys. An exemplary embodiment of the present invention includes: (a) providing a cleaning and etching solution including: (1) 5–35 grams/liter of phosphoric acid; (2) 5–35 grams/liter of hydrogen fluoride; (3) 55–95 grams/liter of sulfamic acid; (4) 55–95 grams/liter of glycol ether; and (5) balance water; (b) contacting the parts with the solution for a time sufficient to achieve the desired amount of cleaning and etching; (c) periodically measuring the etching rate of the solution; (d) when the etching rate is below the required minimum rate, adding sufficient hydrogen fluoride to restore the etching rate above the required minimum rate; and (e) periodically adding sufficient sulfamic acid to prevent the formation of scale made of hydrated aluminum fluoride.

In accordance with aspects of the invention, another exemplary embodiment of the present invention is a process for combined chemically cleaning and etching parts made of aluminum and/or aluminum alloys including: (a) providing a cleaning and etching solution including: (1) 5–35 grams/liter of phosphoric acid; (2) 5–35 grams/liter of hydrogen fluoride; (3) 120–220 grams/liter of sulfamic acid; (4) 55–95 grams/liter of glycol ether; and (5) balance water; (b) contacting the parts with the solution for a time sufficient to achieve the desired amount of cleaning and etching; (c) periodically measuring the etching rate of the solution, (d) when the etching rate is below the required minimum rate, adding sufficient hydrogen fluoride to restore the etching rate above the required minimum rate; and (e) periodically adding sufficient sulfamic acid to prevent the formation of scale made of hydrated aluminum fluoride.

In accordance with further aspects of the invention, another exemplary embodiment of the present invention is absolution for combined chemically cleaning and etching parts made of aluminum and/or aluminum alloys including: (a) 5–35 grams/liter of phosphoric acid; (b) 5–35 grams/liter of hydrogen fluoride; (c) 120–220 grams/liter of sulfamic, acid; (d) 55–95 grams/liter of glycol ether; and (e) balance water.

DETAILED DESCRIPTION OF THE INVENTION

Embodiments of the present invention solve both of the problems presented by the prior art. That is, embodiments of the present invention stabilize the etch rate and prevent scale from forming when cleaning and etching parts made of aluminum and/or aluminum alloys. The term "aluminum" will be used to refer to aluminum and/or aluminum alloys.

The following non-limiting examples illustrate the present invention.

EXAMPLE 1

In Example 1, the starting solution contains the following constituents:

(a) 5–35 grams/liter of phosphoric acid;
(b) 5–35 grams/liter of hydrogen fluoride;
(c) 55–95 grams/liter of sulfamic acid;
(d) 55–95 grams/liter of glycol ether (solvent); and
(e) balance water.

The preferred concentrations are 25–35 grams/liter of phosphoric acid, 25–35 grams/liter of hydrogen fluoride, 80–95 grams/liter of sulfamic acid, and 80–95 grams/liter of glycol ether (solvent).

The solvent is used in the solution in order to clean the aluminum parts by removing any soil that may be on them. The preferred solvent is propylene glycol monomethyl ether. The process is run at ambient temperature. The aluminum parts are immersed in the solution for the time that is sufficient to etch a specified amount.

The etching rate of the solution is measured periodically. When the etching rate falls below the required rate of 0.8 mils per side per hour, it is no longer within the applicable process specification, BAC 5786. About 0.5–1.3 grams per liter of HF are added in order to restore the etch rate above 0.8 mils/side/hr. (This is accomplished, for example, by adding 1.0–2.6 grams/liter of 49% by wt. reagent grade hydrofluoric, acid.) This amount of HF addition was discovered after extensive etch rate testing. Titration results, indicated there was a high acidity level, but the fluoride level did not correspond accordingly. There were no maintenance procedures available for the complex reactions occurring in the acid solution.

However, the HF additions do not mitigate the formation of scale in the tank. X-ray diffraction analysis indicated that the hard scale is primarily hydrated aluminum fluoride. After further research, it was discovered that sulfamic acid must be added in order to prevent the formation of hydrated aluminum fluoride. It was discovered that an adequate concentration of sulfamic acid is needed in order to chelate or otherwise bind with aluminum ions. Aluminum ions are generated during the etching process. Thus, an addition of about 7–28 grams/liter of sulfamic acid is added periodically in order to compensate for the sulfamic acid that is bound by the chelating activity. The addition of sulfamic acid can be performed when additional HF is added to the solution or the sulfamic acid can be added at other times. The requirement is to periodically add sufficient sulfamic acid to prevent the formation of scale made of hydrated aluminum fluoride.

EXAMPLE 2

In Example 2, the starting solution contains the following constituents:

(a) 5–35 grams/liter of phosphoric acid;
(b) 5–35 grams/liter of hydrogen fluoride;
(c) 120–220 grams/liter of sulfamic acid;
(d) 55–95 grams/liter of glycol ether (solvent); and
(e) balance water.

The preferred starting concentrations are 25–35 grams/liter of phosphoric acid, 25–35 grams/liter of hydrogen fluoride, 120–130 grams/liter of sulfamic acid, and 80–95 grams/liter, of glycol ether.

The solvent is used in the solution in order to clean the aluminum parts by removing any soil that may be on them. The preferred solvent is propylene glycol monomethyl ether. The process is run at ambient temperature. The aluminum parts are immersed in the solution for the time that is sufficient to etch a specified amount.

The etching rate of the solution is measured periodically. When the etching rate falls below the required rate of 0.8 mils per side per hour, it is no longer within the specification. About 0.5–1.3 grams per liter of HF are added (accomplished, for example, by adding 1.0–2.6 grams/liter of 49% by wt. reagent grade hydrofluoric acid) in order to restore the etch rate to above 0.8 mils/side/hr.

In, this example, the solution is started with an excess of sulfamic acid in order to prevent the formation of hydrated aluminum fluoride. As explained above, it was discovered that an adequate concentration of sulfamic acid is needed to prevent the formation of hydrated aluminum fluoride. Thus, an addition of about 7–28 grams/liter of sulfamic acid is added periodically in order to compensate for the sulfamic acid that is bound by the chelating activity. The addition of sulfamic acid can be performed when additional HF is added to the solution or the sulfamic acid can be added at other times. The requirement is to periodically add sufficient sulfamic acid to prevent the formation of scale made of hydrated aluminum fluoride.

Unless indicated otherwise, in stating a numerical range for a compound or a temperature or a time or other process matter or property, such a range is intended to specifically designate and disclose the minimum and the maximum for the range and each number, including each fraction and/or decimal, between the stated minimum and maximum for the range. For example, a range of 1 to 10 discloses 1.0, 1.1, 1.2 . . . 2.0, 2.1, 2.2, . . . and so on, up to 10.0. Similarly, a range of 500 to 1000 discloses 500, 501, 502, . . . and so on, up to 1000, including every number and fraction or decimal therewithin. “Up to x” means “x” and every number less than “x”, for example, “up to 5” discloses 0.1, 0.2, 0.3, . . . , and so on up to 5.0.

While the preferred embodiments of the invention have been illustrated and described, as noted above, many changes can be made without departing from the spirit and scope of the invention. Accordingly, the scope of the invention is not limited by the disclosure of the preferred embodiments. Instead, the invention should be determined entirely by reference to the claims that follow.

What is claimed is:

1. A process for combined chemically cleaning and etching parts made of aluminum and/or aluminum alloys comprising:

(a) providing a cleaning and etching solution comprising:
  (1) 5–35 grams/liter of phosphoric acid;
  (2) 5–35 grams/liter of hydrogen fluoride;
  (3) 55–95 grains/liter of sulfamic acid;
  (4) 55–95 grams/liter of glycol ether; and
  (5) balance water;
(b) contacting said parts with said solution for a time sufficient to achieve the desired amount of cleaning and etching;
(c) periodically measuring the etching rate of said solution to determine if the etching rate is at or above the required minimum rate;
(d) when the etching rate is below the required minimum rate, adding sufficient hydrogen fluoride to restore the etching rate above the required minimum rate; and
(e) periodically adding sufficient sulfamic acid to prevent the formation of scale made of hydrated aluminum fluoride.

2. The process of claim 1, paragraph (d), wherein the amount of hydrogen fluoride added is 0.5–1.3 grains per liter.

3. The process of claim 1, paragraph (e), wherein the amount of sulfamic acid added is 7–28 grains per liter.

4. The process of claim 1, wherein the starting amount of phosphoric acid is 25–35 grams per liter.

5. The process of claim 1, wherein the starting amount of hydrogen fluoride is 25–35 grams per liter.

6. The process of claim 1, wherein the starting amount of sulfamic acid is 80–95 grains per liter.

7. The process of claim 1, wherein the starting amount of glycol ether is 80–95grains per liter.

8. The process of claim 1, wherein the glycol ether is propylene glycol monomethyl ether.

9. The process of claim 1, wherein the process is run at ambient temperature.

10. A process for combined chemically cleaning and etching parts made of aluminum and/or aluminum alloys comprising:

(a) providing a cleaning and etching solution comprising:
  (1) 5–35 grams/liter of phosphoric acid;
  (2) 5–35 grams/liter of hydrogen fluoride;
  (3) 120–220 grains/liter of sulfamic acid;
  (4) 55–95 grams/liter of glycol ether; and
  (5) balance water;
(b) contacting said parts with said solution for a time sufficient to achieve the desired amount of cleaning and etching;
(c) periodically measuring the etching rate of said solution to determine if the etching rate is at or above the required minimum rate;
(d) when the etching rate is below the required minimum rate, adding sufficient hydrogen fluoride to restore the etching rate above the required minimum rate; and
(e) periodically adding sufficient sulfamic acid to prevent the formation of scale made of hydrated aluminum fluoride.

11. The process of claim 10, paragraph (d), wherein the amount of hydrogen fluoride added is 0.5–1.3 grains per liter.

12. The process of claim 10, paragraph (e), wherein the amount of sulfamic acid added is 7–28 grains per liter.

13. The process of claim 10, wherein the starting amount of phosphoric acid is 25–35 grains per liter.

14. The process of claim 10, wherein the starting amount of hydrogen fluoride is 25–35 grams per liter.

15. The process of claim 10, wherein the starting amount of sulfamic acid is 120–130 grams per liter.

16. The process of claim 10, wherein the staffing amount of glycol ether is 80–95 grains per liter.

17. The process of claim 10, wherein the glycol ether is propylene glycol monomethyl ether.

18. The process of claim 10, wherein the process is run at ambient temperature.

19. A process for combined chemically cleaning and etching parts made of aluminum and/or aluminum alloys comprising:

(a) providing a cleaning and etching solution comprising:
  (1) 25–35 grams/liter of phosphoric acid;
  (2) 25–35 grains/liter of hydrogen fluoride;
  (3) 120–130 grams/liter of sulfamic acid;
  (4) 80–95 grams/liter of propylene glycol monomethyl ether; and
  (5) balance water;
(b) contacting said parts with said solution for a time sufficient to achieve the desired amount of cleaning and etching;
(c) periodically measuring the etching rate of said solution to determine if the etching rate is at or above the required minimum rate;
(d) when the etching rate is below the required minimum rate, adding 0.5–1.3 grams of hydrogen fluoride; and
(e) periodically adding 7–28 grams per liter of sulfamic acid to prevent the formation of scale made of hydrated aluminum flouride.

20. The process of claim 19, wherein the process is run at ambient temperature.

* * * * *